United States Patent
Okuno

(10) Patent No.: US 11,435,059 B2
(45) Date of Patent: Sep. 6, 2022

(54) WAVELENGTH CONVERSION MEMBER AND WHITE LIGHT EMITTING DEVICE USING SAME

(71) Applicant: Panasonic Intellectual Property Management Co., Ltd., Osaka (JP)

(72) Inventor: Tatsuya Okuno, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/273,194

(22) PCT Filed: Sep. 11, 2019

(86) PCT No.: PCT/JP2019/035684
§ 371 (c)(1),
(2) Date: Mar. 3, 2021

(87) PCT Pub. No.: WO2020/066615
PCT Pub. Date: Apr. 2, 2020

(65) Prior Publication Data
US 2021/0325022 A1    Oct. 21, 2021

(30) Foreign Application Priority Data
Sep. 26, 2018 (JP) ............... JP2018-179939

(51) Int. Cl.
*F21V 7/30* (2018.01)
*F21V 9/32* (2018.01)
(Continued)

(52) U.S. Cl.
CPC ............ *F21V 7/30* (2018.02); *C09K 11/0883* (2013.01); *C09K 11/7706* (2013.01);
(Continued)

(58) Field of Classification Search
CPC ....................................................... F21V 9/32
See application file for complete search history.

(56) References Cited

U.S. PATENT DOCUMENTS

| 8,791,630 | B2 | 7/2014 | Maemura |
| 2017/0184254 | A1 | 6/2017 | Yamashita |
| 2019/0292453 | A1 | 9/2019 | Yonemoto |

FOREIGN PATENT DOCUMENTS

| JP | 5269115 | 5/2013 |
| JP | 2017-120753 A | 7/2017 |

(Continued)

OTHER PUBLICATIONS

International Search Report for corresponding Application No. PCT/JP2019/035684, dated Oct. 29, 2019.
(Continued)

*Primary Examiner* — Vip Patel
(74) *Attorney, Agent, or Firm* — Renner, Otto, Boisselle & Sklar, LLP

(57) ABSTRACT

A wavelength conversion member converts a wavelength of laser light. The wavelength conversion member includes a substrate having reflectivity with respect to the laser light, and a phosphor layer including a phosphor for converting the laser light into light having a longer wavelength than that of the laser light, the phosphor layer being on the substrate. The phosphor layer includes a plurality of concave parts, each having a depth of 50% or more and 80% or less with respect to a film thickness of the phosphor layer and an opening width of 50 μm or more, on a surface of the phosphor layer, the surface irradiated with the laser light. A distance between adjacent concave parts of the plurality of concave parts is smaller than a spot diameter of the laser light to be emitted to the surface of the phosphor layer.

9 Claims, 5 Drawing Sheets

(51) Int. Cl.
*C09K 11/77* (2006.01)
*H01S 5/00* (2006.01)
*C09K 11/08* (2006.01)

(52) U.S. Cl.
CPC .......... *C09K 11/77348* (2021.01); *F21V 9/32* (2018.02); *H01S 5/0087* (2021.01)

(56) References Cited

FOREIGN PATENT DOCUMENTS

| JP | 2018-077535 A | 5/2018 |
| JP | 2013-161561 A | 8/2019 |
| WO | 2018/101348 A1 | 6/2018 |

OTHER PUBLICATIONS

Written Opinion for corresponding Application No. PCT/JP2019/035684, dated Oct. 29, 2019.
Extended European Search Report for corresponding EP Application No. 19865074.9 dated Oct. 8, 2021.

WAVELENGTH CONVERSION MEMBER AND WHITE LIGHT EMITTING DEVICE USING SAME

TECHNICAL FIELD

The present invention relates to a wavelength conversion member and a white light emitting device using the same.

BACKGROUND ART

A white light emitting device has been known to obtain white light by irradiating a wavelength conversion member including a phosphor with laser light and additively mixing a part of the laser light and a part of fluorescence emitted from the phosphor. Such a white light emitting device irradiates the phosphor with laser light having a high power density to improve the light output. It is however known that the saturation of fluorescent output of the phosphor occurs with the increase in the power of laser light, and thus the conversion efficiency from laser light to white light may decrease. Moreover, fluorescence has orientation distribution with isotropic diffusion (non-directivity), while laser light has orientation distribution with high straightness (directivity). Due to such properties of fluorescence and laser light, color irregularity may occur in the irradiation spot of the output light, and color uniformity may be lowered.

Patent Literature 1 discloses a light emitting element that reduces coherent light having strong directivity and high coherence. Specifically, Patent Literature 1 discloses a light emitting element that emits fluorescence by receiving excitation light emitted from an excitation light source. The light emitting element includes multiple phosphor particles deposited in layers on a substrate. Provided on the surface of the phosphor particles is a coating layer, and the coating layer has a concavo-convex shape on the surface of the light emitting element. Forming the concavo-convex shape on the surface of the light emitting element as described above scatters the excitation light emitted to the light emitting element and causes the excitation light to lose the straightness and directivity, thus improving the color unevenness of the irradiation spot of the output light.

CITATION LIST

Patent Literature

Patent Literature 1: Japanese Patent No. 5269115

SUMMARY OF INVENTION

As in Patent Literature 1, providing a coating layer on the surface of the phosphor particles and forming the concavo-convex shape on the coating layer on the surface of the light emitting element can indeed scatter the excitation light and improve the color unevenness of the irradiation spot of the output light. In contrast, it becomes difficult to increase the chromaticity range of output light. For example, as the excitation light becomes difficult to reach the phosphor particles, the absorption ratio of the excitation light by the phosphor particles decreases, and consequently it becomes difficult to obtain output light in the low color temperature range.

The present invention has been made in consideration of such problems as described above, which are inherent in the prior art. An object of the present invention is to provide a wavelength conversion member that improves color unevenness of output light while increasing the chromaticity range of output light, and a white light emitting device using the wavelength conversion member.

In order to solve the above-described problems, a wavelength conversion member according to one aspect of the present invention is a member for converting a wavelength of laser light. The wavelength conversion member includes: a substrate having reflectivity with respect to the laser light; and a phosphor layer including a phosphor for converting the laser light into light having a longer wavelength than that of the laser light, the phosphor layer being on the substrate. The phosphor layer includes a plurality of concave parts, each having a depth of 50% or more and 80% or less with respect to a film thickness of the phosphor layer and an opening width of 50 µm or more, on a surface of the phosphor layer, the surface irradiated with the laser light. A distance between adjacent concave parts of the plurality of concave parts is smaller than a spot diameter of the laser light to be emitted to the surface of the phosphor layer.

A white light emitting device according to another aspect of the present invention includes: a laser light source configured to emit laser light; and the wavelength conversion member.

DESCRIPTION OF EMBODIMENTS

The present embodiment is described below with reference to the drawings. Each of the below described embodiments shows a preferred specific example according to the present embodiments. Accordingly, the numerical values, shapes, materials, components, arrangement positions of the components, connecting forms, and the like shown in the following embodiments are merely examples and are not intended to limit the present embodiments.

[Wavelength Conversion Member]

Figure 1:
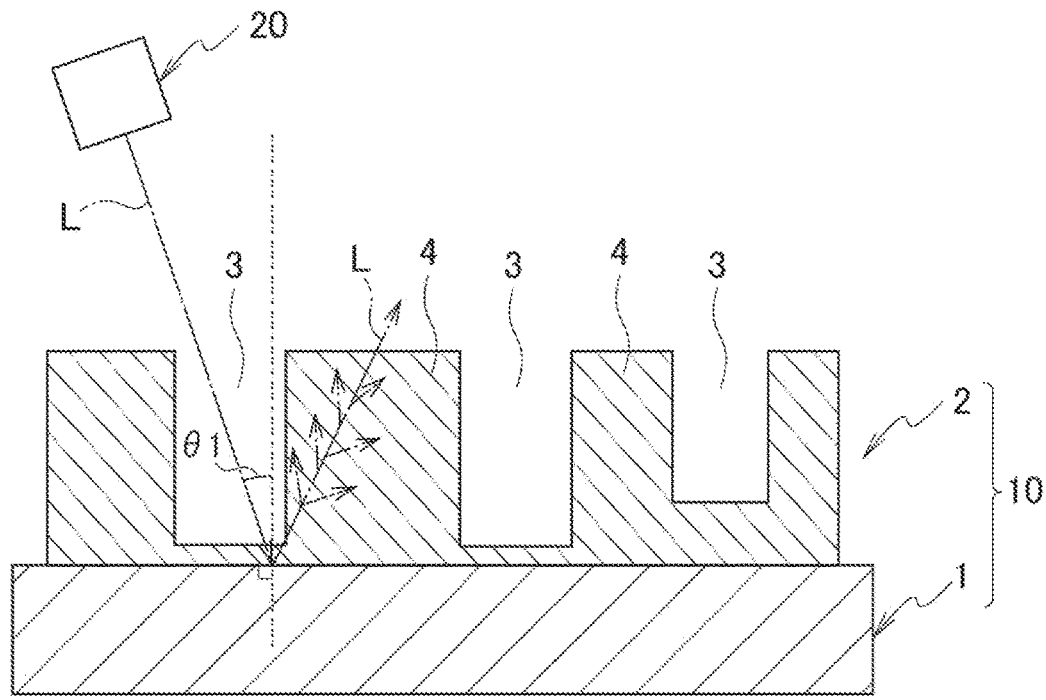
FIG. 1 is a schematic cross-sectional view of a white light emitting device using a wavelength conversion member according to a present embodiment.

A wavelength conversion member 10 according to a present embodiment is a member that converts a wavelength of laser light L serving as excitation light. As seen in FIG. 1, the wavelength conversion member 10 includes a substrate 1 having reflectivity with respect to the laser light L, and a phosphor layer 2 including a phosphor that converts the laser light L into light having a wavelength longer than that of the laser light L, the phosphor layer 2 being on the substrate 1. As seen in FIG. 1, the wavelength conversion member 10 is characterized by emitting output light in a direction in which the emitted laser light L is reflected by the substrate 1 and the phosphor layer 2.

The laser light L emitted to the wavelength conversion member has a wavelength to be absorbed by the phosphor included in the phosphor layer 2. The laser light L is characterized by a power density higher than that of general diffused light and high straightness and directivity.

At least one of ultraviolet laser light emitting ultraviolet rays or visible laser light emitting visible rays may be used as the laser light L emitted to the wavelength conversion member 10. The laser light L preferably has a maximum intensity within a wavelength range of 440 nm or more and less than 470 nm, more preferably within a wavelength range of 445 nm or more and less than 460 nm. The phosphor is thus efficiently excited. When the laser light L has a maximum intensity within the above wavelength range, the laser light L becomes blue light with good visibility and is used without waste as output light of a white light emitting device 100 as well as excitation light of the phosphor. Further, when such a laser light is used, a blue semiconductor laser element, which is relatively inexpensive and has high actual results, may be used as the laser light source 20, so that the white light emitting device 100 is suitable for industrial production.

The specific numerical value of the light density in the laser light L is not limited but is preferably 3 $W/mm^2$ or more and less than 100 $W/mm^2$, for example. When the light density of the laser light L is 3 $W/mm^2$ or more, a difference from an LED illumination becomes clear, and thus the white light emitting device 100 obtained has high value as a differentiated product. When the light density of the laser light L is less than 100 $W/mm^2$, the white light emitting device 100 obtained has less heat generation due to energy loss of the phosphor layer 2.

Note that the maximum value of light density of the laser light L preferable for a general illumination is 3 $W/mm^2$ or more and less than 20 $W/mm^2$. The maximum value of light density of the laser light L preferable for an endoscope is 10 $W/mm^2$ or more and less than 50 $W/mm^2$. The maximum value of the light density of the laser light L preferable for a projector is 40 $W/mm^2$ or more and less than 100 $W/mm^2$.

The substrate 1 of the wavelength conversion member 10 preferably has reflectivity to the laser light L, and preferably is formed from a reflective member that reflects the laser light L, for example. By using the reflective member as the substrate 1, as described later, the laser light L is reflected by the surface of the substrate 1, and the reflected light efficiently excites the phosphor in the phosphor layer 2.

The shape of the substrate 1 is not limited as long as the phosphor layer 2 is held on the surface thereof and may be plate-like, for example. The reflective member making up the substrate 1 is not limited as long as it reflects the laser light L, and a member formed from any solid substance may be used. As the reflective member, a member having a metal or a metal oxide at least on its surface may be used. The metal of the reflective member is, for example, aluminum or silicon, and the metal oxide of the reflective member is, for example, alumina. The reflective member formed from such a material is preferable because heat generated by irradiation with the laser light L is efficiently exhausted.

The substrate 1 may be provided with a reflective film for reflecting the laser light L on the surface of the reflective member. Examples of the reflective film includes a thin film formed from silver.

In the wavelength conversion member 10, the phosphor layer 2 contains at least the phosphor. As the phosphor, a phosphor that absorbs a part of energy of the laser light L and emits fluorescence having a wavelength different from that of the laser light L in an isotropic orientation distribution may be used. Examples of such a phosphor includes a $Ce^{3+}$ activated phosphor containing $Ce^{3+}$ as an emission center.

Examples of the $Ce^{3+}$ activated phosphor include phosphors based on a compound having a garnet crystal structure, such as an aluminate, a silicate, an aluminosilicate or the like. As such a phosphor, at least one selected from the group consisting of $Lu_3Ga_2(AlO_4)_3{:}Ce^{3+}$, $Lu_3Al_2(AlO_4)_3{:}Ce^{3+}$, $Y_3Ga_2(AlO_4)_3{:}Ce^{3+}$, $Y_3Al_2(AlO_4)_3{:}Ce^{3+}$, $(Y,Gd)_3Al_2(AlO_4)_3{:}Ce^{3+}$, $Ca_3Sc_2(SiO_4)_3{:}Ce^{3+}$, $Lu_2CaMg_2(SiO_4)_3{:}Ce^{3+}$, and $(Lu,Ca)_3(Al,Mg)_2((Al,Si)O_4)_3{:}Ce^{3+}$ may be used.

Examples of the $Ce^{3+}$ activated phosphor include phosphors based on a complex oxide containing a rare earth element or an alkaline earth metal, such as a phosphate, a silicate, or an aluminate. As such a phosphor, at least one selected from the group consisting of $LaPO_4{:}Ce^{3+}$, $YPO_4{:}Ce^{3+}$, $Y_2SiO_5{:}Ce^{3+}$, $Ca_2MgSi_2O_7{:}Ce^{3+}$, $YAlO_3{:}Ce^{3+}$, and $CeMgAl_{11}O_{19}$ may be used.

Examples of the $Ce^{3+}$ activated phosphor include phosphors based on a nitride or oxynitride containing a rare earth element or an alkaline earth metal. As such a phosphor, at least one selected from the group consisting of $Y_2Si_3O_3N_4{:}Ce^{3+}$, $La_3Si_6N_{11}{:}Ce^{3+}$, $CaAlSiN_3{:}Ce^{3+}$, and $Ca(Al,Si)_2(N,O)_3{:}Ce^{3+}$ may be used.

As the phosphor, a phosphor that has a relatively long afterglow and easy saturation of fluorescence output when directly irradiated with the laser light L may be also used. Examples of such a phosphor include phosphors containing ions that emit fluorescence by electronic energy transition of at least one of a parity forbidden type or a spin forbidden type. Examples of the ions emitting fluorescence by electronic energy transition of at least one of the parity forbidden type or the spin forbidden type include ions emitting fluorescence by the transition between f-electron levels of a rare earth element and ions emitting fluorescence by the transition between d-electron levels of a transition metal element. Examples of such ions include trivalent rare earth ions ($Pr^{3+}$, $Eu^{3+}$, $Gd^{3+}$, $Tb^{3+}$) except $Ce^{3+}$, and monovalent to tetravalent transition metal ions having an electronic configuration of $3d^n$ ($Cr^{3+}(3d^3)$, $Mn^{2+}(3d^5)$, $Mn^{4+}(3d^3)$, $Fe^{3+}(3d^5)$).

The phosphor preferably contains one ion selected from the group consisting of $Eu^{2+}$, $Eu^{3+}$, $Tb^{3+}$, and $Mn^{4+}$ as an emission center. Such a phosphor emits visible light suitable for illumination use, and thus the wavelength conversion member 10 obtained is easy to design an illumination light.

Examples of the $Eu^{2+}$ activated phosphor include phosphors based on a complex oxide of an alkaline earth metal. As such a phosphor, at least one selected from the group consisting of an alkaline earth metal silicate, such as $AE_2SiO_4{:}Eu^{2+}$, an alkaline earth metal aluminate, such as $AEMgAl_{10}O_{17}{:}Eu^{2+}$, an alkaline earth metal halophosphate, such as $AE_{10}(PO_4)_6Cl_2{:}Eu^{2+}$, and an alkaline earth metal phosphate, such as $AE_2P_2O_7{:}Eu^{2+}$, may be used. Note that AE represents at least one selected from the group consisting of Ca, Sr, and Ba.

Examples of the $Eu^{2+}$ activated phosphor include phosphors based on a complex nitride of an alkaline earth metal (AE). As such a phosphor, at least one selected from the group consisting of $AE_2Si_5N_8:Eu^{2+}$, $AEAlSi_4N_7:Eu^{2+}$, and $AEAlSiN_3:Eu^{2+}$ may be used. Examples of the $Eu^{2+}$ activated phosphor include phosphors based on a complex oxynitride of an alkaline earth metal (AE). As such a phosphor, at least one selected from the group consisting of $AESi_2O_2N_2:Eu^{2+}$ and $AE_3Si_6O_{12}N_2:Eu^{2+}$ may be used.

Examples of the $Eu^{3+}$ activated phosphor include phosphors based on an oxide or a complex oxide of a rare earth element. As such a phosphor, at least one selected from the group consisting of a rare earth oxide, such as $RE_2O_3:Eu^{3+}$, a rare earth vanadate, such as $REVO_4:Eu^{3+}$ and $RE(P,V)O_4:Eu^{3+}$, a rare earth phosphate, such as $REPO_4:Eu^{3+}$, a rare earth silicate, such as $RE_2SiO_5:Eu^{3+}$, a rare earth aluminate, such as $RE_3Al_5O_{12}:Eu^{3+}$, and a rare earth borate, such as $REBO_3:Eu^{3+}$ may be used. Note that RE represents at least one selected from the group consisting of Sc, Y, La, and Gd.

Examples of the $Eu^{3+}$ activated phosphor include phosphors based on an oxysulfide of a rare earth element (RE). Examples of such a phosphor include $RE_2O_2S:Eu^{3+}$.

Examples of the $Tb^{3+}$ activated phosphor include phosphors based on an oxide or a complex oxide of a rare earth element. As such a phosphor, at least one selected from the group consisting of a rare earth oxide, such as $RE_2O_3:Tb^{3+}$, a rare earth vanadate, such as $REVO_4:Tb^{3+}$ and $RE(P,V)O_4:Tb^{3+}$, a rare earth phosphate, such as $REPO_4:Tb^{3+}$, a rare earth silicate, such as $RE_2SiO_5:Tb^{3+}$, a rare earth aluminate, such as $RE_3Al_5O_{12}:Tb^{3+}$, and a rare earth borate, such as $REBO_3:Tb^{3+}$ may be used. Note that RE represents at least one selected from the group consisting of Sc, Y, La, and Gd.

Examples of the $Tb^{3+}$ activated phosphor include phosphors based on a complex nitride, a complex oxynitride, or a complex carbonitride of a rare earth element (RE). As such a phosphor, $Y_2Si_4N_6C:Tb^{3+}$ may be used. Examples of the $Tb^{3+}$ activated phosphor include phosphors based on an oxysulfide of a rare earth element (RE). As such a phosphor, $RE_2O_2S:Tb^{3+}$ may be used.

Examples of the $Mn^{4+}$ activated phosphor include phosphors based on germanate containing magnesium. As such a phosphor, $3.5MgO·0.5MgF2·GeO_2:Mn^{4+}$ may be used. Examples of the $Mn^{4+}$ activated phosphor include an alkali metal complex fluoride. As such a phosphor, $K_2SiF_6:Mn^{4+}$ may be used.

The phosphor contained in the phosphor layer 2 is preferably a red phosphor that emits red fluorescence having a fluorescence peak within a wavelength range of 600 nm or more and less than 660 nm, particularly 610 nm or more and less than 640 nm. As a result, the output light of the wavelength conversion member 10 includes a red-based fluorescent component, and thus the wavelength conversion member 10 is advantageous in lighting applications requiring high color rendering, particularly, an average color rendering index Ra.

Examples of such a red phosphor include nitride phosphors activated by $Eu^{2+}$ and fluoride phosphors activated by $Mn^{4+}$, and nitride phosphors are particularly preferable. Such a red phosphor has been researched for use in LED lighting and has high actual results, so that the wavelength conversion member 10 obtained has excellent reliability.

The phosphor is preferably a powdered phosphor. Such a powdered phosphor is not only readily available, but also the phosphor layer 2 can be manufactured by using an orthodox film-forming technique cultivated in conventional light source technology and display device technology. The wavelength conversion member 10 is thus advantageous in terms of industrial production.

The phosphor contained in the phosphor layer 2 is preferably a group of particles, and the average particle diameter of the phosphor is preferably 15 μm or more and less than 50 μm. The average particle diameter of the phosphor is more preferably 20 μm or more and less than 40 μm, further preferably 25 μm or more and less than 35 μm. When the phosphor is a particle group of particles and the average particle diameter of the phosphor is within the above range, the phosphor in the phosphor layer 2 efficiently absorbs the laser light L and emits high intensity fluorescence. The average particle diameter of the phosphor is obtained by observing the phosphor layer 2 with a scanning electron microscope and measuring the particle diameter of multiple phosphors.

Further, the phosphor layer 2 may be a sintered body formed by sintering multiple phosphor particles, or a polycrystalline phosphor.

In the present embodiment, the phosphor layer 2 is preferably a wavelength converter formed from only an inorganic compound. Accordingly, the phosphor layer 2 has excellent thermal conductivity advantageous in heat radiation of the phosphor. As a result, the phosphor is excited by using the laser light L of high output, and thus the wavelength conversion member 10 easy to increase the output is obtained. Since there is no fear of burning of the phosphor layer 2, it becomes possible to irradiate laser light having a relatively high energy density and to increase the output of the wavelength conversion member 10.

As a wavelength converter formed from an inorganic compound, at least one selected from the group consisting of a sintered body of a phosphor, a green compact of a phosphor, a structure in which phosphor particles are sealed with glass, a structure obtained by bonding phosphor particles with a binder and/or fine particles made of an inorganic compound, and a composite obtained by fusing a phosphor and a compound, may be used. Moreover, as the wavelength converter, a composite formed by combining these and other phosphor particles may be used. Note that examples of the composite formed by fusing a phosphor and a compound include a composite formed by fusing a phosphor and alumina.

The phosphor layer 2 is preferably a wavelength converter formed by sealing the phosphor with a resin material. A wavelength converter obtained by sealing with a resin material is relatively easy to manufacture, and thus a desired wavelength converter is manufactured at low cost. As the resin material, a transparent organic material, such as silicone resin, may be used, for example.

In the wavelength conversion member 10 according to the present embodiment, the phosphor layer 2 formed on the substrate 1 includes a plurality of concave parts 3 and a plurality of convex parts 4. That is, the phosphor layer 2 has a surface irradiated with the laser light L, on which the plurality of concave parts 3 and the plurality of convex parts 4 are formed. The concave parts 3 each preferably have a depth of 50% or more and 80% or less with respect to the film thickness of the phosphor layer 2 and an opening width of 50 μm or more. The term "film thickness of the phosphor layer" refers to the average value of the thickness of convex parts having mountain heights from the highest peak to the fifth highest in descending order in a profile curve obtained by sweeping an arbitrary part of the surface of the phosphor layer by 2 mm when the surface properties of the phosphor layer is measured using a surface roughness measuring instrument.

Figure 3:
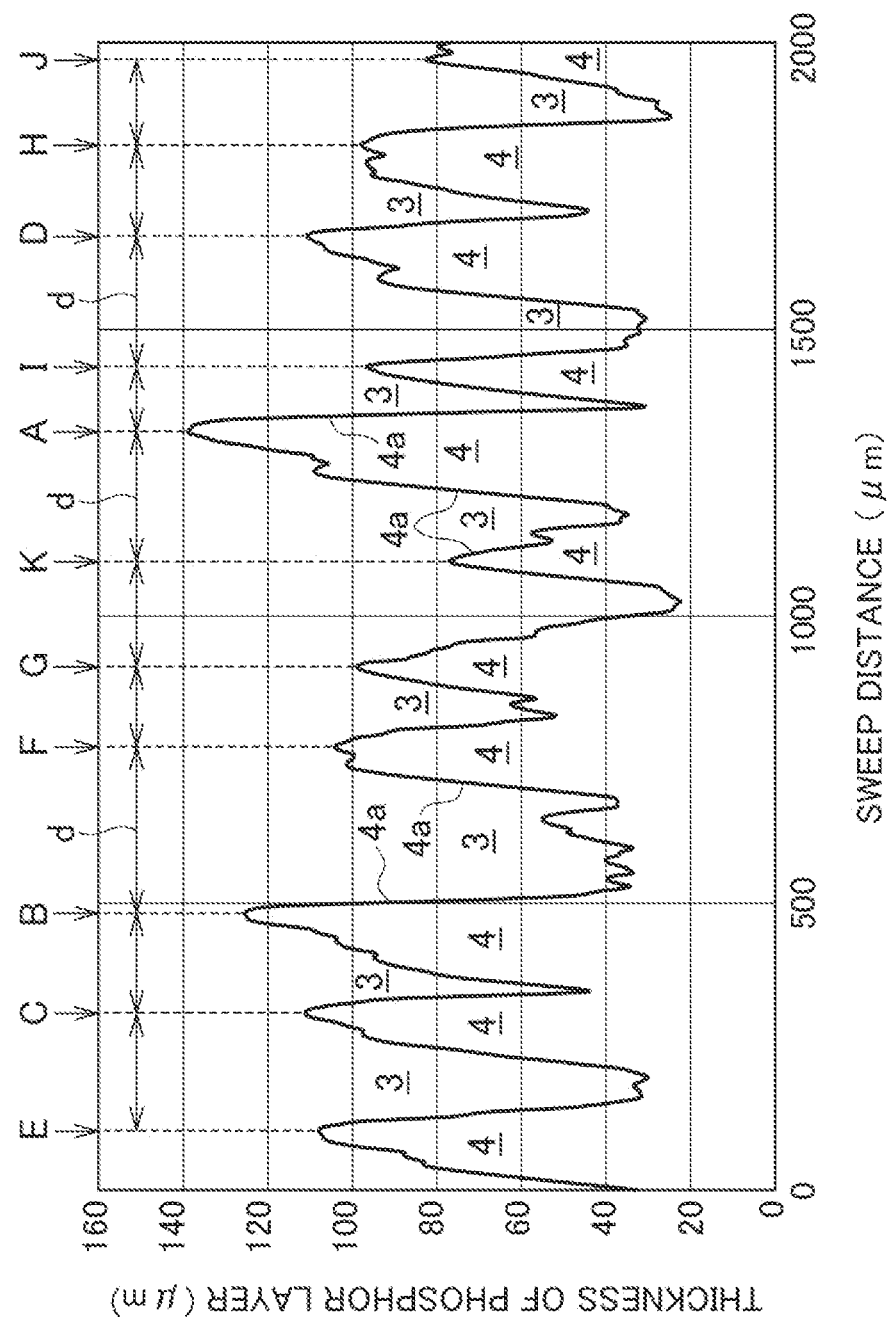
FIG. 3 is a graph illustrating a profile curve representing a relationship between the thickness of a phosphor layer and a sweep distance for explaining an opening width of a concave part in the phosphor layer of the wavelength conversion member.

Specifically, the film thickness of the phosphor layer 2 is obtained as follows. FIG. 3 illustrates an example of a profile curve obtained by sweeping the surface of the phosphor layer 2 by 2 mm using a surface roughness measuring instrument. In the profile curve in FIG. 3, peaks indicated by arrows A to E are the convex parts 4 having mountain heights from the highest peak to the fifth highest in descending order. The average thickness of the convex parts 4 illustrated by arrows A to E is defined as the film thickness of the phosphor layer 2. In FIG. 3, the thickness of the convex part 4 of the arrow A is 138 μm, the thickness of the convex part 4 of the arrow B is 125 μm, the thickness of the convex part 4 of the arrow C is 111 μm, the thickness of the convex part 4 of the arrow D is 109 μm, and the thickness of the convex part 4 of the arrow E is 108 μm. Accordingly, the film thickness of the phosphor layer 2 in FIG. 3 is 118.2 μm that is the average thickness of these values.

The concave parts 3 each preferably have a depth of 50% or more and 80% or less with respect to the film thickness of the phosphor layer 2. Specifically, in the profile curve in FIG. 3, it is preferable that the concave parts 3 each have a depth of 50% or more and 80% or less with respect to the film thickness of the phosphor layer 2, that is, a depth of 59.1 μm to 94.6 μm with respect to the film thickness (118.2 μm).

The concave parts 3 each preferably have an opening width of 50 μm or more. The "opening width" here is a peak-to-peak distance (distance between peaks) of the convex parts 4 having an inclined surface 4a that forms a depth of 50% or more and 80% or less with respect to the film thickness of the phosphor layer 2 in the profile curve obtained in the same manner as the film thickness of the phosphor layer. Specifically, as seen in FIG. 3, it is a peak-to-peak distance d of the convex parts 4 having the inclined surface 4a forming the depth described above. The concave parts 3 of the phosphor layer 2 in the present embodiment each preferably have the opening width of 50 μm or more, which is the peak-to-peak distance d. Thus, when the opening width of the concave parts 3 is 50 μm or more, the excitation light easily enters the phosphor layer 2, making it easier to enhance the color uniformity of the output light while increasing the chromaticity range of the output light.

As described above, the opening width of the concave parts 3 is preferably 50 μm or more, and more preferably 100 μm or more. The upper limit of the opening width of the concave parts 3 is preferably 1000 μm, and preferably 500 μm.

The film thickness of the phosphor layer 2 is not particularly limited, but is preferably from 50 μm to 1000 μm, more preferably from 50 μm to 300 μm, and still more preferably from 50 μm to 200 μm.

As seen in FIG. 1, the laser light L emitted from the laser light source 20 reaches the phosphor layer 2 in the wavelength conversion member 10 having the above-described configuration. A part of the laser light L is directly emitted to the convex part 4 in the phosphor layer 2 and absorbed by the phosphor, but the other of the laser light L passes through the concave part 3 in the phosphor layer 2 and partially reaches the surface of the substrate 1. The surface of the substrate 1 adjacent to the phosphor layer 2 reflects the laser light L, and thus the laser light L reaching the substrate 1 is reflected by the surface of the substrate 1. The reflected laser light L enters through a wall surface of the convex part 4 adjacent to the concave part 3 and is absorbed by the phosphor included in the convex part 4. The absorbed laser light L has its wavelength converted and becomes fluorescence having a wavelength different from that of the laser light L. Note that a part of the laser light L emitted to the phosphor layer 2 may be reflected by the surface of the phosphor layer 2, or reflected by the surface of the substrate 1 and then transmitted through the phosphor layer 2 without being absorbed by the phosphor. Accordingly, the wavelength conversion member 10 emits output light obtained by additively mixing the laser light L and the fluorescence emitted from the phosphor.

Here, the laser light L entering the phosphor layer 2 of the wavelength conversion member 10 through the wall surface of the convex part 4 is scattered by the surface of the phosphor included in the phosphor layer 2, grain boundaries of the polycrystal, or the like, so that the laser light L loses its straightness and directivity and becomes to have an isotropic orientation distribution. The fluorescence emitted from the phosphor also has an isotropic orientation distribution. Accordingly, the output light obtained by additively mixing the laser light L transmitted through the phosphor layer 2 and the fluorescence has its color unevenness reduced, making it easier to enhance its color uniformity.

The laser light L entering through the wall surface of the convex part 4 is simultaneously absorbed by the phosphor included in the phosphor layer 2 while being scattered. Thus, the laser light L is converted into light having a long wavelength by the phosphor while being converted into an isotropic orientation distribution by scattering, so that the color temperature of the output light is lowered. As a result, the wavelength conversion member 10 makes it easier to enhance the color uniformity of the output light while increasing the chromaticity range of the output light.

Figure 2:
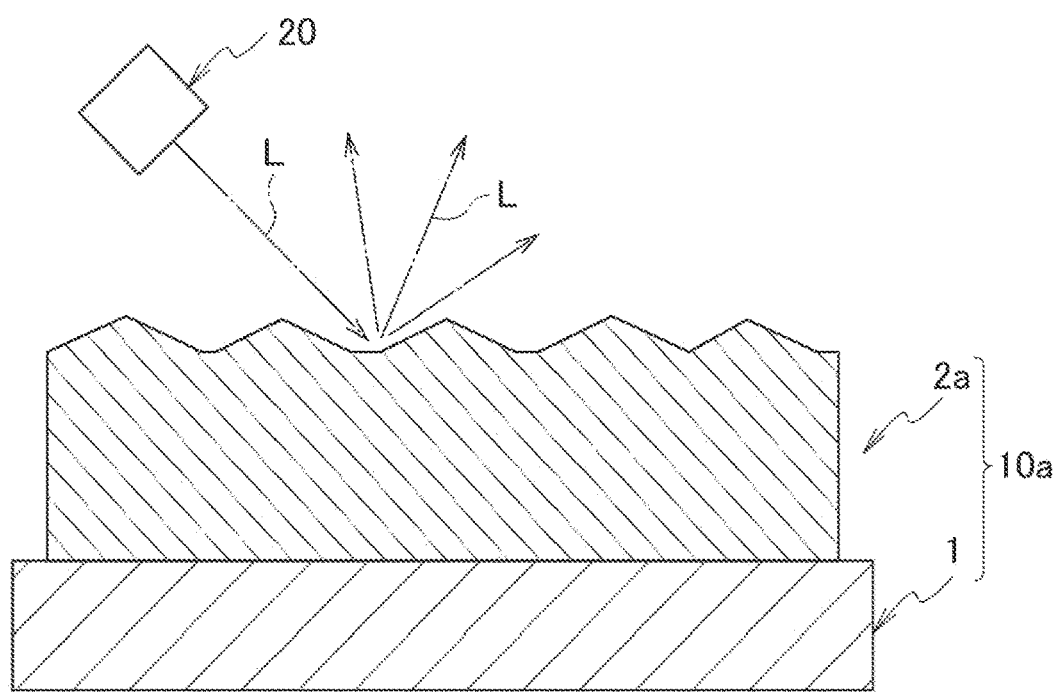
FIG. 2 is a schematic cross-sectional view of an optical output device using a conventional wavelength conversion member.

FIG. 2 schematically illustrates an example of a wavelength conversion member in which the opening width of concave parts formed in a phosphor layer 2a is less than 50 μm and the depth thereof is less than 50% of the film thickness. In a wavelength conversion member 10a in FIG. 2, the laser light L emitted from the laser light source 20 reaches the phosphor layer 2a. A part of the laser light L is absorbed by the phosphor in the phosphor layer 2a, while the other of the laser light L is reflected and scattered by the surface of the phosphor layer 2a. At this time, the scattered light is not absorbed by the phosphor, and thus it is difficult to lower the color temperature of the output light by increasing the absorption ratio of the excitation light. As a result, it is difficult to increase the chromaticity range of the output light.

In the wavelength conversion member 10, the distance between the adjacent concave parts 3 is preferably smaller than the spot diameter of the laser light L emitted to the surface of the phosphor layer 2. Thus, the laser light L passes through the concave part 3 in the phosphor layer 2 and easily reaches the surface of the substrate 1. After the laser light L is reflected by the surface of the substrate 1, the laser light L enters the phosphor layer 2 through the wall surface of the convex part 4, so that a part of the laser light L is absorbed while being scattered by the phosphor. Consequently, the wavelength conversion member 10 makes it easier to enhance the color uniformity of the output light while increasing the chromaticity range of the output light. The spot diameter of the laser light L emitted to the surface of the phosphor layer 2 is the size of the spot on the surface of the phosphor layer when the phosphor layer 2 is viewed from a direction perpendicular to the surface of the substrate 1. The size of the spot is a maximum distance between two points on the outer periphery of the spot. In other words, the spot diameter of the laser light L is the diameter when the shape of the spot on the surface of the phosphor layer is substantially circular or the length of the major axis when the shape is substantially elliptical.

In the wavelength conversion member 10, the distance between the adjacent concave parts 3 is more preferably ½ or less, more preferably ⅓ or less of the spot diameter of the laser light L emitted to the surface of the phosphor layer 2. The spot diameter of the laser light L is preferably 100 μm to 10 mm.

In the wavelength conversion member 10, the number of concave parts 3 is preferably 3 or more per mm on the surface of the phosphor layer 2. That is, when the surface of the phosphor layer 2 is swept by using a surface roughness measuring instrument, it is preferable that three or more concave parts 3 exist per mm. As the number of the concave parts 3 on the surface of the phosphor layer 2 increases, the laser light L loses its straightness and directivity and becomes to have an isotropic orientation distribution, thus reducing color unevenness of the output light and enhancing color uniformity. As the number of the concave parts 3 increases, the laser light L is reflected by the surface of the substrate 1 and enters the convex part 4, thus making it easier to enhance the color uniformity of the output light while increasing the chromaticity range of the output light.

In the wavelength conversion member 10, the phosphor layer 2 is preferably formed from a phosphor and includes multiple phosphor particles for scattering the laser light L. In the wavelength conversion member 10, the phosphor layer 2 is preferably formed from a polycrystal having grain boundaries in at least a part thereof. The phosphor layer 2 contains multiple phosphor particles, and thus the laser light L entering the phosphor layer 2 is scattered by the surface of the phosphor particles. Consequently, the laser light L loses its straightness and directivity and becomes to have an isotropic orientation distribution similar to that of fluorescence. Accordingly, it becomes easier to enhance the color uniformity of the output light obtained by additively mixing the laser light L and the fluorescence.

In the wavelength conversion member 10, the phosphor layer 2 may have an air void for scattering the laser light L. Providing the phosphor layer 2 with multiple voids scatters the laser light L entering the phosphor layer 2 at the interface between the voids and the phosphor. Consequently, the laser light L loses its straightness and directivity and becomes to have an isotropic orientation distribution similar to that of fluorescence. Accordingly, it becomes easier to enhance the color uniformity of the output light obtained by additively mixing the laser light L and the fluorescence.

The method of manufacturing the wavelength conversion member 10 according to the present embodiment is not limited, and a method of forming the concave parts 3 in the phosphor layer 2 may be applied. The wavelength conversion member 10 may be manufactured by a screen printing method, for example. The screen printing method is preferable because it is excellent in productivity and the wavelength conversion member can be produced at a low cost.

Specifically, first, a phosphor coating liquid to be applied to the surface of the substrate 1 is prepared. The phosphor coating liquid includes, for example, a solvent, a thickener, an inorganic adhesive, and a phosphor. As the solvent, for example, distilled water or an organic solvent is used. As the thickener, for example, polyethylene oxide (PEO) is used. As the inorganic adhesive, for example, ultrafine particle alumina is used.

The phosphor coating liquid may be prepared, for example, by dissolving a thickener in a solvent and then adding and stirring a phosphor and an inorganic adhesive in this order. The thickness of the phosphor layer 2 is adjustable by changing the viscosity of the phosphor coating liquid by changing the mixing amount of the phosphor and the solvent in the phosphor coating liquid.

Next, the phosphor coating liquid is applied to the surface of the substrate 1 by the screen printing method to form a coating film. In this case, the mesh of the screen printing plate is preferably formed from a material having high water repellency and high oil repellency. By using a mesh having high water repellency and oil repellency, a large number of irregularities are formed on the surface of the coating film when the phosphor coating liquid is pushed out to the substrate 1 through the holes of the mesh and then the mesh is removed. Then, with the irregularities being on the surface of the coating film, the substrate 1 on which the coating film is provided is heated to remove the solvent and the thickener, thereby obtaining the wavelength conversion member 10 having the phosphor layer 2 on which the concave parts 3 are formed. The heating temperature of the substrate 1 provided with the coating film is not limited but may be, for example, 150° C. to 400° C.

The depth and opening width of the concave parts 3 in the phosphor layer 2 of the wavelength conversion member 10 is adjustable by changing the viscosity of the phosphor coating liquid or the number of meshes of the mesh used.

The wavelength conversion member 10 according to the present embodiment may also be obtained by forming a phosphor layer containing a phosphor on the surface of the substrate 1 and then forming the concave parts 3 using a focused ion beam (FIB). The FIB is preferable because it is easy to control the depth and the number of the concave parts 3 and to aim at desired characteristics of the wavelength conversion member 10.

As described above, the wavelength conversion member 10 according to the present embodiment is a member that converts the wavelength of the laser light L. The wavelength conversion member 10 includes the substrate 1 having reflectivity with respect to the laser light L, and the phosphor layer 2 including a phosphor that converts the laser light L into light having a wavelength longer than that of the laser light L and formed on the substrate 1. The phosphor layer 2 includes the plurality of concave parts 3 each having the depth of 50% or more and 80% or less with respect to the film thickness of the phosphor layer 2 and the opening width of 50 μm or more on the surface to be irradiated with the laser light L. The distance between the adjacent concave parts 3 is smaller than the spot diameter of the laser light L emitted to the surface of the phosphor layer 2. The phosphor layer 2 has the predetermined concave parts 3 as described above, and thus the laser light L is scattered by the phosphor included in the phosphor layer 2 to form an isotropic orientation distribution. This reduces the color unevenness and enhances the color uniformity of the output light obtained by additively mixing the laser light L and the fluorescence. In the wavelength conversion member 10, the laser light L is reflected by the surface of the substrate 1 and then enters the phosphor layer 2 through the wall surface of the convex part 4, and thus a part of the laser light L is scattered and absorbed by the phosphor. Consequently, the wavelength conversion member 10 makes it easier to enhance the color uniformity of the output light while increasing the chromaticity range of the output light.

As described above, in the wavelength conversion member 10, the ratio of the laser light L absorbed in the vicinity of the substrate 1 increases, and thus heat generated in the absorption process of the laser light L is more easily exhausted through the substrate 1. Accordingly, it is easier to prevent the phosphor from being inactivated or burnt due to temperature quenching or heat generation. In general, the wavelength conversion member that outputs white light at a low color temperature tends to generate heat because the absorption ratio of excitation light into phosphor is high and tends to cause inactivation and burning due to temperature quenching and heat generation of the phosphor. However, the configuration according to the present embodiment provides white light having a low color temperature while reducing heat generation.

It is obvious that the chromaticity of the output light emitted from the wavelength conversion member 10 is freely adjustable by the material, area, film thickness, phosphor density, or the like, of the phosphor layer 2. Further, the ratio of the laser light L to the fluorescence emitted from the phosphor is adjustable by the film thickness of the phosphor layer 2 or the phosphor density.

[White Light Emitting Device]

Next, a white light emitting device according to the present embodiment is described in detail with reference to the drawings.

As seen in FIG. 1, the white light emitting device 100 according to the present embodiment includes a laser light source 20 emitting the laser light L and the wavelength conversion member 10 described above. The white light emitting device 100 is a light emitting device having a structure called a reflection type. That is, the white light emitting device 100 is characterized by output light emitted in a direction in which the laser light L is reflected by the substrate 1 and the phosphor layer 2.

As the laser light source 20 of the white light emitting device 100, a light emitting element emitting the laser light L may be used. Such a laser light source 20 is not limited, but for example, a laser diode may be used. A laser diode is preferable as it is easy to construct a small device while obtaining a high output.

The wavelength conversion member 10 includes, as described above, the substrate 1 having reflectivity to the laser light L, and the phosphor layer 2 including a phosphor that converts the laser light L into light having a wavelength longer than that of the laser light L, formed on the substrate 1, and further including predetermined concave parts.

To emit the output light from the white light emitting device 100, first, a laser light source 20 is used, and the laser light L is emitted downward from a side of the laser light source 20 adjacent to the phosphor layer 2. A part of the laser light L emitted to the phosphor layer 2 is absorbed by the phosphor of the phosphor layer 2 to excite the phosphor. The excited phosphor emits fluorescence isotropically in a three-dimensional direction. Here, the surface of the substrate 1 adjacent to the phosphor layer 2 has a function of reflecting fluorescence. Thus, the fluorescence emitted from the phosphor toward the substrate 1 is reflected by the surface of the substrate 1 and emitted in the output direction.

A part of the laser light L emitted to the phosphor layer 2 passes through the concave part 3 of the phosphor layer 2 and reaches the surface of the substrate 1. The surface of the substrate 1 adjacent to the phosphor layer 2 reflects the laser light L, and thus the laser light L is reflected by the surface of the substrate 1. The reflected laser light L is absorbed by the phosphor in the convex part 4 adjacent to the concave part 3 to excite the phosphor. Then, the excited phosphor emits fluorescence isotropically in a three-dimensional direction. However, since the surface of the substrate 1 has a function of reflecting fluorescence as described above, the fluorescence emitted from the phosphor toward the substrate 1 is reflected by the surface of the substrate 1 and is emitted in the output direction.

Further, a part of the laser light L emitted to the phosphor layer 2 is reflected by the surface of the phosphor layer 2, or reflected by the surface of the substrate 1 and then transmitted through the phosphor layer 2 without being absorbed by the phosphor, so as to be emitted upward. Accordingly, the white light emitting device 100 emits the output light obtained by additively mixing the laser light L and the fluorescence emitted from the phosphor.

Here, the fluorescence emitted from the phosphor of the phosphor layer 2 has an isotropic orientation distribution. Further, the laser light L reflected by the surface of the substrate 1 to enter the phosphor layer 2 is scattered by the surface of the phosphor included in the phosphor layer 2 and loses its straightness and directivity, thus having an isotropic orientation distribution. Accordingly, the output light obtained by additively mixing the laser light L and the fluorescence has the color unevenness reduced and the color uniformity enhanced. In the white light emitting device 100, as entering the phosphor layer 2 through the wall surface of the convex part 4 after being reflected by the surface of the substrate 1, a part of the laser light L is absorbed while being scattered by the phosphor. Accordingly, the wavelength conversion member 10 makes it easier to enhance the color uniformity of the output light while increasing the chromaticity range of the output light.

In the white light emitting device 100, an incident angle θ1 of the laser light L with respect to the substrate 1 of the wavelength conversion member 10 preferably exceeds 0°. That is, the laser light L emitted from the laser light source 20 may be incident perpendicularly to the surface of the substrate 1 adjacent to the phosphor layer 2 but is preferably incident obliquely so that the incident angle θ1 exceeds 0°. When the incident angle θ1 of the laser light L exceeds 0°, the laser light L is reflected by the surface of the substrate 1 adjacent to the phosphor layer 2 and enters the phosphor layer 2 obliquely from below. The laser light L entering the phosphor layer 2 is absorbed by the phosphor or scattered by the surface of the phosphor particles. Accordingly, the output light having enhanced color uniformity is efficiently emitted. The incident angle θ1 of the laser light L with respect to the substrate 1 of the wavelength conversion member 10 is not limited but may be, for example, more than 0° and less than 70°.

When the incident angle θ1 of the laser light L is 0°, a part of the laser light L may enter through the wall surface of the convex part 4 as a result of being diffused by fine irregularities on the bottom surface of the concave part 3 or the surface of the substrate 1. To achieve the effect, an uneven structure or an arbitrary configuration for diffusing light may be intentionally arranged on the bottom surface of the concave part 3 or the surface of the substrate 1. This is preferable because it becomes easier to make a smaller light emitting device.

In the white light emitting device 100, a lens for condensing the laser light L emitted from the laser light source 20 on the phosphor layer 2 may be interposed between the laser light source 20 and the wavelength conversion member 10. A light guiding mechanism for transmitting and condensing the laser light L emitted from the laser light source 20 on the phosphor layer 2 may be interposed between the laser light source 20 and the wavelength conversion member 10. As the light guiding mechanism, an optical fiber may be used, for example.

In the white light emitting device 100 in FIG. 1, the laser light source 20 is positioned directly above the wavelength conversion member 10, but the white light emitting device 100 is not limited to such a mode. For example, the laser light source 20 may be positioned other than directly above the white light emitting device 100, and the optical path of the laser light L may be changed by a mirror or the like. In this case, as described above, the laser light L does not necessarily have to propagate in space, and a predetermined light guiding mechanism, such as an optical fiber, may be provided as a part of the way of entering the wavelength conversion member 10 from the laser light source 20.

In the white light emitting device 100, the output light is preferably utilized as an illumination light. Thus, the white light emitting device has high industrial utility value and high demand. The white light emitting device 100 is preferably used for any of the following purposes: studio lighting, outdoor lighting, store lighting, light control system, facility lighting, marine lighting, and endoscopes.

EXAMPLES

The present embodiment is described in more detail using an example and a comparative example below. However, the present embodiment is not limited to these examples.
[Manufacturing of Wavelength Conversion Member]

Example

Yttrium aluminum garnet particles (YAG particle), CASN particles ($CaAlSiN_3$: Eu), magnesium fluoride particles, and polysilazane were weighed in a mass ratio of 1: 0.4:0.02: 0.05 and then mixed. Yttrium aluminum garnet particles used were manufactured by NEMOTO & CO., LTD., having a central particle diameter of 18 μm. CASN particles used were manufactured by Mitsubishi Chemical Corporation, having a central particle diameter of 18 μm. Magnesium fluoride particles used have a central particle diameter of 40 nm. Polysilazane used was perhydropolysilazane (product number NL-120A) manufactured by Merck Performance Materials Ltd.

A paste-like coating liquid was obtained by appropriately mixing terpinol and ethylene glycol with the obtained mixture.

Next, on the surface of a surface-polished silicon substrate having a thickness of 0.775 mm and a length of 25 mm on the longitudinal and lateral sides, a silver film having a film thickness of 120 nm was formed by sputtering. Then, the coating liquid was applied onto the silver film of the silicon substrate by using a screen printing plate and a screen printing machine to form a film. The screen printing plate was made of Tetoron (registered trademark), and the mesh count (the number of threads per inch) was 120. The coating liquid was applied to the screen printing plate by sweeping a silicone squeegee at a speed of 3 cm/sec.

Then, the silicon substrate on which the coating liquid was deposited was heat-treated at a temperature of up to 400° C., and thus the wavelength conversion member according to the present example in which the silicon substrate and the phosphor layer were integrated was obtained.

Comparative Example

A wavelength conversion member according to the comparative example was obtained in the same manner as in the example except that a screen printing plate made of stainless steel (SUS) and having a mesh count of 120 was used.
[Evaluation]

The surface properties of the phosphor layers in the wavelength conversion members obtained in the example and the comparative example were measured. Further, the color temperature and conversion efficiency of the output light, the surface temperature of the wavelength conversion member, and the orientation distribution of the output light were measured when the wavelength conversion member was irradiated with the laser light.

(Surface Properties of the Phosphor Layer)

Figure 4:
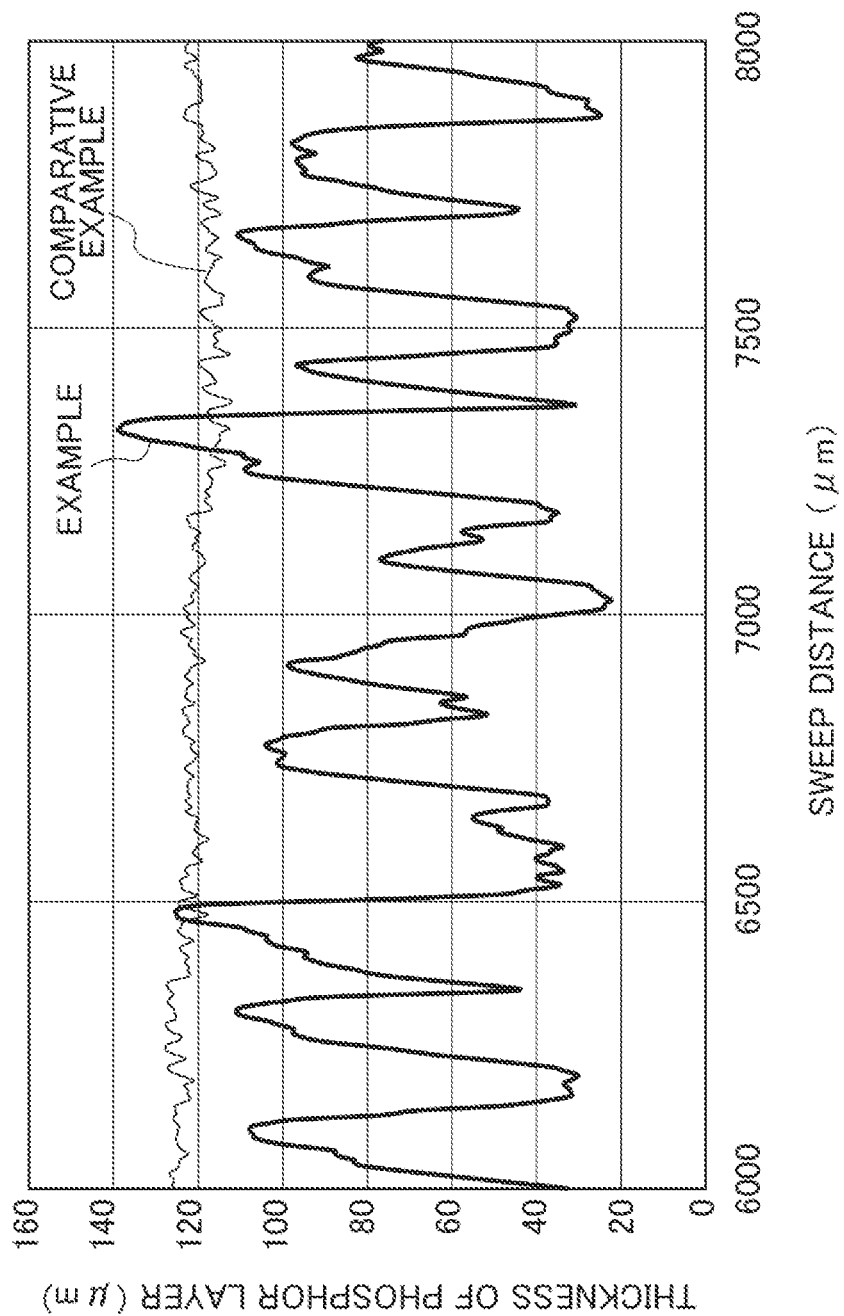
FIG. 4 is a graph illustrating a profile curve representing a relationship between the thickness of a phosphor layer and a sweep distance in a wavelength conversion member according to an example and that according to a comparative example.

The surface properties of the phosphor layers in the wavelength conversion members of the example and the comparative example were measured by a stylus profilometer (product name: Dektak, manufactured by Bruker). The measurement results of the surface properties are illustrated in FIG. 4. The graph in FIG. 4 illustrates a profile curve representing the relationship between the thickness of the phosphor layer and the sweep distance in the wavelength conversion members of the example and the comparative example. "0 μm" on the vertical axis of the graph in FIG. 4 means the level of the substrate surface.

(Color Temperature and Conversion Efficiency of the Output Light)

As excitation light, laser light having a center wavelength of 444 nm and a power density of about 4 $W/mm^2$ was emitted to the surfaces of the phosphor layers in the wavelength conversion members of the example and the comparative example. A blue laser light source having a center wavelength of 444 nm was used as the light source of the laser light, and a fiber coupled high brightness blue direct diode laser BLUE IMPACT (registered trademark) manufactured by SHIMADU CORPORATION was used as the blue laser light source. As a result of irradiating the wavelength conversion members of the example and the comparative example with the laser light, mixed light obtained by additively mixing the blue light of the excitation light, the yellow-green light, and the red light was obtained in both the example and the comparative example.

Next, the wavelength spectrum, color temperature, and output energy amount of the mixed light obtained from the wavelength conversion members of the example and the comparative example were measured using an integrating sphere and a spectrophotometer. A multi-channel spectrometer MCPD-9800 manufactured by Otsuka Electronics Co., Ltd. was used as the spectrophotometer. The conversion efficiency is obtained by dividing the obtained output energy amount by the input energy amount.

The conversion efficiency and color temperature in the wavelength conversion members of the example and the comparative example are seen in Table 1. Table 1 illustrates the ratio of the conversion efficiency in the example when the conversion efficiency in the comparative example is 1.

(Surface Temperature of the Wavelength Conversion Member)

The temperature distribution on the surface of the phosphor layer was measured by adjusting the focus of the thermal camera to the phosphor layer in the wavelength conversion member of each example while emitting the laser light under the laser irradiation conditions described above. The highest temperature in the obtained temperature distribution was used as the surface temperature of the wavelength conversion member. The surface temperatures of the wavelength conversion members of the example and the comparative example are illustrated in Table 1. Table 1 illustrates the ratio of the surface temperature of the example when the surface temperature of the comparative example is 1.

(Orientation Distribution of the Output Light)

Figure 5:
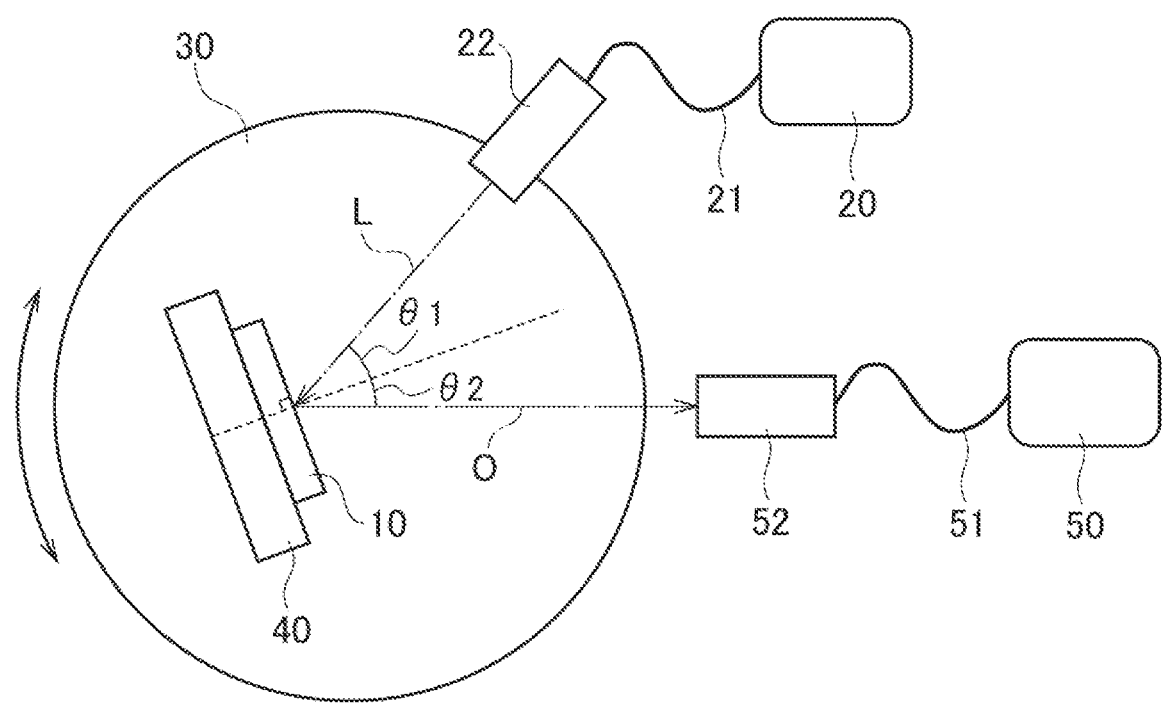
FIG. 5 is a schematic diagram illustrating an apparatus for measuring orientation distribution of output light in the wavelength conversion member according to the example and that according to the comparative example.

Using the measuring apparatus in FIG. 5, orientation distributions of the output light in the wavelength conversion members of the example and the comparative example were measured. The measuring apparatus in FIG. 5 includes a rotating stage 30 and a heat sink 40 attached to the surface of the rotating stage 30. To the heat sink 40, the wavelength conversion member 10 of each example is attached. The measuring apparatus further includes a laser light source 20 and a laser output part 22 connected via an optical fiber 21 to the laser light source 20. The measuring apparatus further includes a spectrophotometer 50 and an output light detecting section 52 connected via an optical fiber 51 to the spectrophotometer 50. The laser light source 20 and the spectrophotometer 50 were the same as those used for the measurement of the color temperature and the conversion efficiency of the output light.

As seen in FIG. 5, on the rotating stage 30, a laser output part 22 is fixed, and when the rotating stage 30 rotates, the laser output part 22 rotates together with the heat sink 40 and the wavelength conversion member 10. The output light detecting section 52 is not fixed to the rotating stage 30.

As seen in FIG. 5, first, the wavelength conversion member 10 of each example is bonded to the heat sink 40 using a heat radiation sheet. At this time, the substrate side of the wavelength conversion member 10 is adhered to the heat sink 40. The heat radiation sheet used was a SERCON (registered trademark) manufactured by Fuji Polymer Industries Co., Ltd.

Then, the laser light L was emitted from the laser output part 22 to the surface of the phosphor layer of the wavelength conversion member 10 under the same laser irradiation condition as the above-described measurement of the color temperature and the conversion efficiency. At this time, the incident angle θ1 of the laser light L was adjusted to be 45°. Then, the output light detecting section 52 and the spectrophotometer 50 provided outside the rotating stage 30 measured the wavelength spectrum of the mixed light (output light O) of the laser light L diffused by the wavelength conversion member 10 and the fluorescence emitted from the phosphor layer.

Next, the rotating stage 30 was rotated in 0.5° increments so that the radiation angle θ2 increased, and the wavelength spectrum of the output light O at each angle was measured. The intensity at a wavelength of 444 nm, which is the peak wavelength of the laser light, and the intensity at a wavelength of 538 nm, which is the peak wavelength of the fluorescence, were extracted from the obtained wavelength spectrum. Thus, the dependence of the radiation angle and the relative intensity ratio of each wavelength is defined as the orientation distribution of the output light. The relative intensity ratio is an arbitrary number in which the intensity at the radiation angle of each wavelength θ2=0° is 1.

Figure 6:
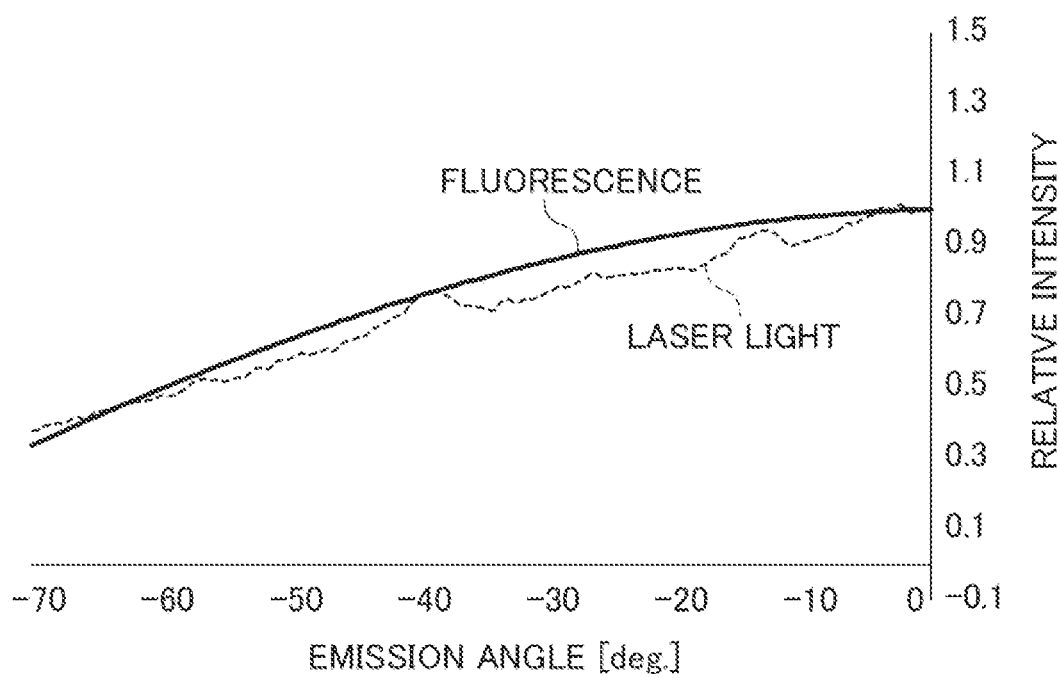
FIG. 6 is a graph illustrating a relationship between an emission angle and a relative intensity of fluorescence and laser light emitted from the wavelength conversion member according to the example.
Figure 7:
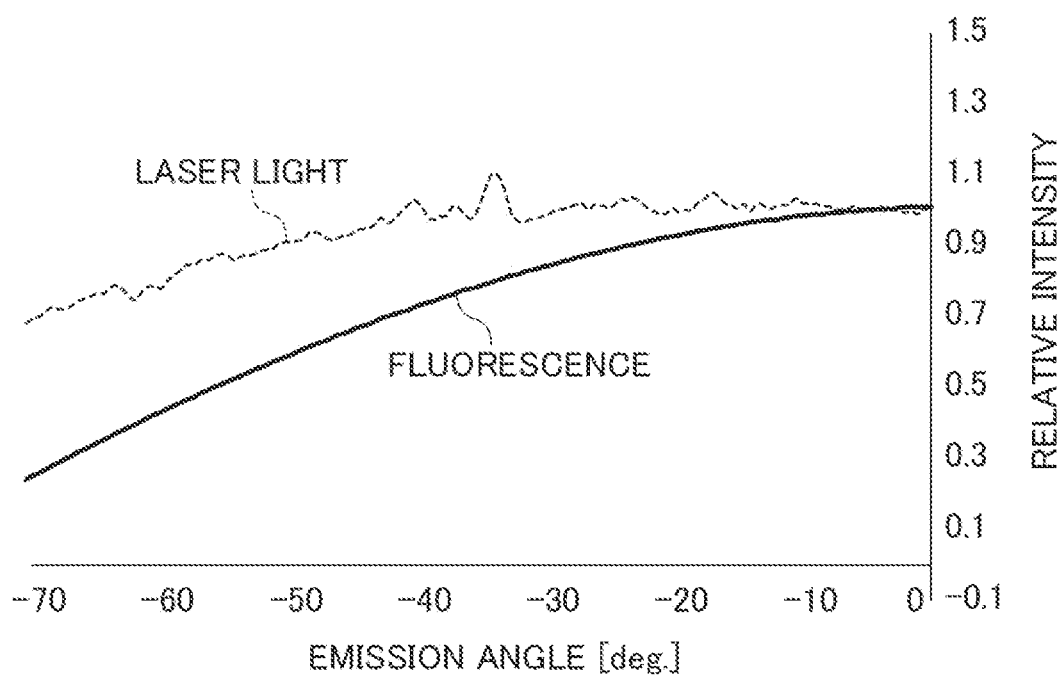
FIG. 7 is a graph illustrating a relationship between an emission angle and a relative intensity of fluorescence and laser light emitted from the wavelength conversion member according to the comparative example.

FIG. 6 illustrates orientation distributions of the laser light and fluorescence contained in the output light O at each angle regarding the wavelength conversion member of the example. FIG. 7 illustrates orientation distributions of the laser light and fluorescence contained in the output light O at each angle regarding the wavelength conversion member of the comparative example.

TABLE 1

| | EXAMPLE | COMPARATIVE EXAMPLE |
|---|---|---|
| CONVERSION EFFICIENCY RATIO | 1 | 1 |
| COLOR TEMPERATURE (∝ ABSORPTION RATIO) | 3500K | 4000K |
| SURFACE TEMPERATURE RATIO OF PHOSPHOR LAYER | 0.9 | 1 |

First, the profile curve of the example in FIG. 4 coincides with the profile curve in FIG. 3. As seen from FIGS. 3 and 4, the wavelength conversion member of the example has a plurality of concave parts formed on the surface of the phosphor layer. Further, it is seen that the concave parts formed each have a depth of 50% or more and 80% or less with respect to the film thickness of the phosphor layer and an opening width of 50 μm or more. In contrast, the wavelength conversion member of the comparative example only has small concave parts formed on the surface of the phosphor layer, and it is seen that there is no concave part having a depth and an opening width as in the example.

As seen in Table 1, the wavelength conversion members of the example and the comparative example had similar conversion efficiencies of laser light. However, the color temperature of the output light of the example was lower than that of the output light of the comparative example. That is, the output light of the example contains more yellow-green light emitted from the YAG particles and more red light emitted from the CASN particles than the output light of the comparative example, and thus the color temperature is lowered. Accordingly, it is understood that providing a plurality of concave parts in the phosphor layer as in the wavelength conversion member of the example improves the absorption ratio of the excitation light by the phosphor and enhances the emission intensity of the fluorescence.

Further, as seen in Table 1, the wavelength conversion member of the example has the surface temperature of the phosphor layer lower than that of the comparative example. In other words, the wavelength conversion member of the example has a higher ratio of the laser light entering the phosphor layer after being reflected by the surface of the substrate, and thus the laser light is easily absorbed by the phosphor in the vicinity of the substrate. In this case, it is understood that when the phosphor generates heat, the generated heat is efficiently discharged through the substrate and the heat sink as the phosphor exists in the vicinity of the substrate.

As seen from FIG. 6, in the wavelength conversion member of the example, the relative intensities of the laser light and the fluorescence decrease equally as the radiation angle θ2 increases. In contrast, as seen from FIG. 7, in the wavelength conversion member of the comparative example, the difference between the relative intensities of laser light and fluorescence increases as the radiation angle θ2 increases, As described above, in the wavelength conversion member of the example, when the radiation angle θ2 increases, the difference between the relative intensity of the laser light and that of the fluorescence is small, and thus the color unevenness of the output light is small and the color uniformity is enhanced. In contrast, in the wavelength conversion member of the comparative example, as the radiation angle θ2 increases, the intensity of the laser light increases more than that of the fluorescence, so that the color unevenness of the output light increases.

Although the present embodiment has been described with reference to the examples, the present embodiment is not limited thereto, and various modifications can be made within the scope of the gist according to the present embodiment.

The entire content of Japanese Patent Application No. 2018-179939 (application date: Sep. 26, 2018) is incorporated herein by reference.

INDUSTRIAL APPLICABILITY

The present disclosure provides a wavelength conversion member that improves the color unevenness of output light while increasing the chromaticity range of output light, and a white light emitting device using the wavelength conversion member.

REFERENCE SIGNS LIST

1 SUBSTRATE
2 PHOSPHOR LAYER
3 CONCAVE PART
10 WAVELENGTH CONVERSION MEMBER
20 LASER LIGHT SOURCE
100 WHITE LIGHT EMITTING DEVICE
L LASER LIGHT
d PEAK-TO-PEAK DISTANCE (OPENING WIDTH)

The invention claimed is:

1. A white light emitting device comprising:
a laser light source configured to emit laser light;
a wavelength conversion member for converting a wavelength of the laser light, comprising:
  a substrate having reflectivity with respect to the laser light, the substrate not transmitting the laser light; and
  a phosphor layer comprising a phosphor for converting the laser light into light having a longer wavelength than that of the laser light, the phosphor layer being on the substrate and having a film thickness of 50 pm to 200 pm,
wherein the phosphor layer includes: a plurality of concave parts, each having a depth of 50% or more and 80% or less with respect to the film thickness of the phosphor layer and an opening width of 50 µm or more; and a plurality of convex parts adjacent to the plurality of concave parts, on a surface of the phosphor layer, the surface irradiated with the laser light,
wherein the laser light enters the phosphor layer through a wall surface of the plurality of convex parts after reaching a surface of the substrate through the plurality of concave parts in the phosphor layer and being reflected by the surface of the substrate, and
wherein a distance between adjacent concave parts of the plurality of concave parts is smaller than a spot diameter of the laser light to be emitted to the surface of the phosphor layer.

2. The white light emitting device according to claim 1, wherein the concave parts are in an amount of three or more per mm on the surface of the phosphor layer.

3. The white light emitting device according to claim 1, wherein the phosphor layer is formed of the phosphor and includes a plurality of phosphor particles for scattering the laser light.

4. The white light emitting device according to claim 1, wherein the phosphor layer includes an air void for scattering the laser light.

5. The white light emitting device according to claim 1, wherein an incident angle of the laser light with respect to the substrate of the wavelength conversion member exceeds 0°.

6. The white light emitting device according to claim 1, wherein heights of the plurality of convex parts are different from each other.

7. The white light emitting device according to claim 1, an incident angle of the laser light with respect to the substrate of the wavelength conversion member is more than 0° and less than 70°.

8. The white light emitting device according to claim 1, wherein the distance between adjacent concave parts of the plurality of concave parts is ½ or less of the spot diameter of the laser light to be emitted to the surface of the phosphor layer.

9. The white light emitting device according to claim 1, wherein the spot diameter of the laser light is 100 µm to 10 mm.

* * * * *